United States Patent [19]

Kaufman et al.

[11] Patent Number: 5,070,602
[45] Date of Patent: Dec. 10, 1991

[54] METHOD OF MAKING A CIRCUIT ASSEMBLY

[75] Inventors: Lance R. Kaufman, 8001 N. Mohave, Paradise Valley, Ariz. 85253; John A. Dombeck, Milwaukee, Wis.

[73] Assignee: Lance R. Kaufman, Paradise Valley, Ariz.

[21] Appl. No.: 482,346

[22] Filed: Feb. 16, 1990

Related U.S. Application Data

[63] Continuation-in-part of Ser. No. 478,467, Feb. 12, 1990, Pat. No. 4,990,720, which is a continuation-in-part of Ser. No. 469,350, Jan. 24, 1990, Pat. No. 5,032,691, which is a continuation-in-part of Ser. No. 180,476, Apr. 12, 1988, Pat. No. 4,902,854.

[51] Int. Cl.⁵ ............................................. H01R 43/00
[52] U.S. Cl. ........................................ 29/827; 29/413; 29/592.1; 357/74
[58] Field of Search ............... 29/827, 413, 414, 592.1; 357/74

[56] References Cited

U.S. PATENT DOCUMENTS

| | | |
|---|---|---|
| 3,744,120 | 7/1973 | Burgess et al. |
| 3,766,634 | 10/1973 | Babcock et al. |
| 3,854,892 | 12/1974 | Burgess et al. |
| 3,911,553 | 10/1975 | Burgess et al. |
| 3,958,075 | 5/1976 | Kaufman. |
| 3,993,411 | 11/1976 | Babcock et al. |
| 3,994,430 | 11/1976 | Cusano et al. |
| 4,129,243 | 12/1978 | Cusano et al. |
| 4,156,148 | 5/1979 | Kaufman. |
| 4,196,411 | 4/1980 | Kaufman. |
| 4,215,235 | 7/1980 | Kaufman. |
| 4,218,724 | 8/1980 | Kaufman. |
| 4,246,697 | 1/1981 | Smith ................... 29/827 |
| 4,250,481 | 2/1981 | Kaufman. |
| 4,266,140 | 5/1981 | Kaufman. |
| 4,355,463 | 10/1982 | Burns ................. 29/413 X |
| 4,394,530 | 7/1983 | Kaufman. |
| 4,445,271 | 5/1984 | Grabbe ................ 29/827 X |
| 4,449,165 | 5/1984 | Kaufman. |
| 4,449,292 | 5/1984 | Kaufman. |
| 4,488,202 | 12/1984 | Kaufman. |
| 4,498,120 | 2/1985 | Kaufman. |
| 4,546,410 | 10/1985 | Kaufman. |
| 4,546,411 | 10/1985 | Kaufman. |
| 4,554,613 | 11/1985 | Kaufman. |
| 4,574,162 | 3/1986 | Kaufman. |
| 4,577,387 | 3/1986 | Kaufman. |
| 4,630,174 | 12/1986 | Kaufman. |
| 4,700,273 | 10/1987 | Kaufman. |
| 4,713,723 | 12/1987 | Kaufman. |
| 4,724,514 | 2/1988 | Kaufman. |
| 4,736,520 | 4/1988 | Morris. |
| 4,739,449 | 4/1988 | Kaufman. |
| 4,779,060 | 10/1988 | Henden. |
| 4,788,765 | 12/1988 | Kaufman et al. |
| 4,818,895 | 4/1989 | Kaufman. |
| 4,819,042 | 4/1989 | Kaufman. |
| 4,831,723 | 5/1989 | Kaufman. |
| 4,879,633 | 11/1989 | Kaufman. |

OTHER PUBLICATIONS

"Over 50 years of experience with the Direct Bond Copper process", Tegmen Corp., 1201 East Fayette Street, Syracuse, New York 13210.

Primary Examiner—Carl J. Arbes
Attorney, Agent, or Firm—Andrus, Sceales, Starke & Sawall

[57] ABSTRACT

An electric circuit assembly and method provides direct bonding of a copper lead frame pattern (430) on a ceramic substrate (402), including the provision of numerous isolated lead frame segments of small size, without requiring individual oxidation nor placement of same on the substrate, and eliminating loss of alignment during fusing during direct bonding. The lead frame pattern (430) includes a plurality of lead frames (432) interconnected and held together by support bridges (434) therebetween. The support bridges (434) are designed to vaporize, open, retract and disappear during the direct bonding operation, resulting in direct bonded fusion of the copper lead frames (432) to the ceramic substrate (402), and eliminating any remnant of the support bridges (434).

5 Claims, 11 Drawing Sheets

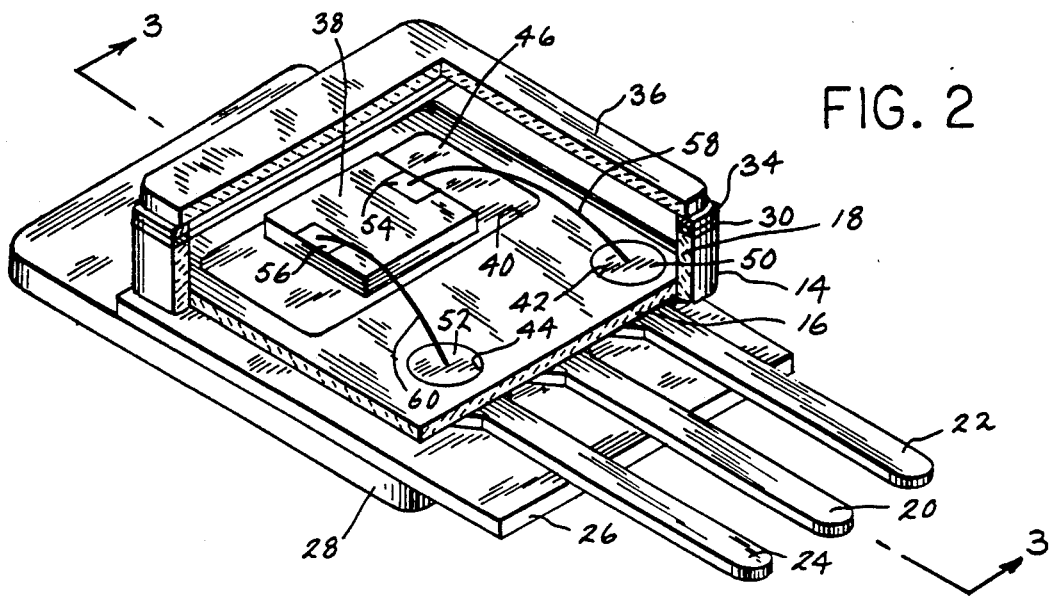
FIG. 2
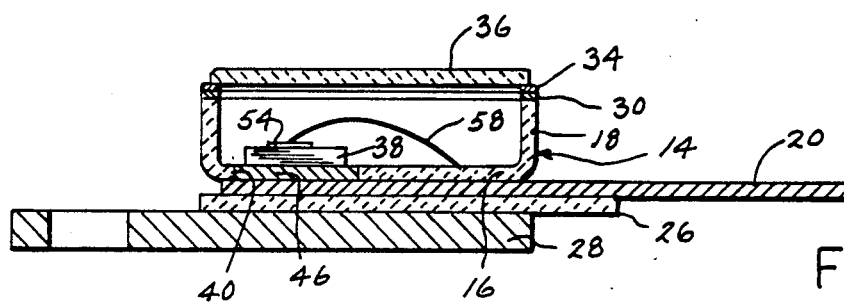
FIG. 3
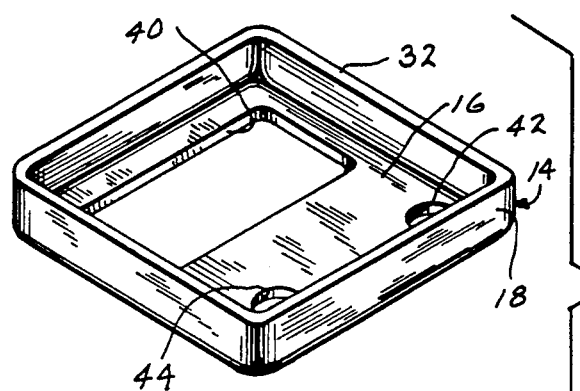
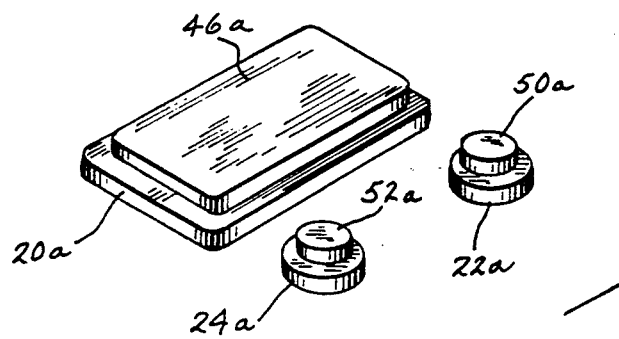
FIG. 4

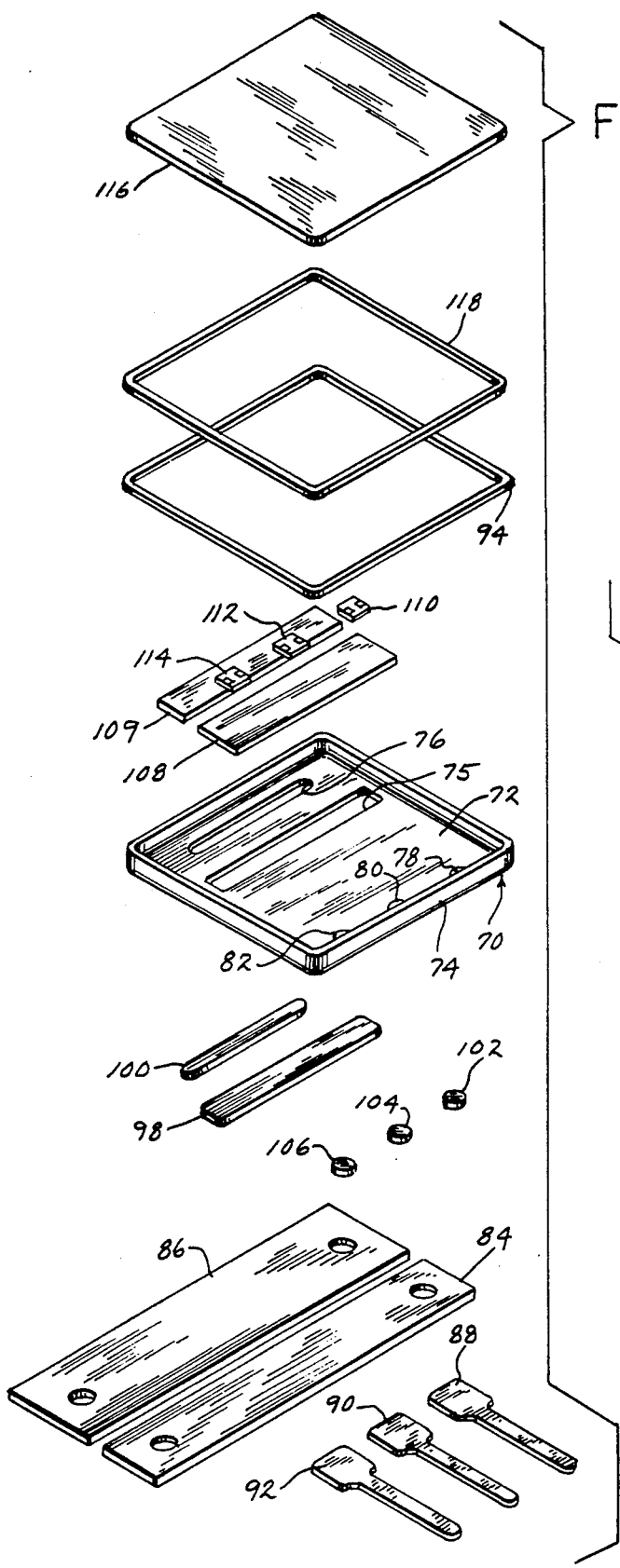

METHOD OF MAKING A CIRCUIT ASSEMBLY

CROSS REFERENCE TO RELATED APPLICATIONS

This application is a continuation in part of application Ser. No. 07/478,467, filed Feb. 12, 1990, now U.S. Pat. No. 4,990,720, which is a continuation in part of application Ser. No. 07/469,350, filed Jan. 24, 1990, now U.S. Pat. No. 5,032,691, which is a continuation in part of application Ser. No. 07/180,476, filed Apr. 12, 1988 now U.S. Pat. No. 4,902,854.

BACKGROUND AND SUMMARY

The present invention arose out of continuing development efforts in the noted parent applications. The invention provides a lead frame pattern having a plurality of lead frames interconnected and held together by support bridges therebetween which are designed to disappear during a direct bonding operation.

Electric circuit assemblies in the field of the present invention typically include an electrically insulating thermally conductive non-metallic refractory substrate, e.g. ceramic, having electrically conductive metallic lead frames, e.g. copper, mounted on the substrate, and electric components, e.g. semiconductor chips, mounted on the lead frames. The structure is covered by an insulating housing which in turn is mounted to a heat sink such that the bottom surface of the ceramic substrate is in intimate contact with the heat sink. Examples of such circuit assemblies are given in the noted parent applications.

The copper lead frames are mounted to the ceramic in various manners, for example by a solder reflow operation, or by a direct bond operation, both of which processes are known in the art.

Direct bonding of the copper to the ceramic involves placing the copper lead frame in contact with the ceramic substrate, heating the copper lead frame and the ceramic substrate to a temperature below the melting point of the copper lead frame to form a eutectic with the lead frame which wets the lead frame and the substrate, and cooling the lead frame and the substrate, with the lead frame bonded to the substrate. The lead frame is pre-oxidized, and the heating is done in an inert atmosphere, or alternatively the heating is done in a reactive oxygen gas atmosphere. Examples of the direct bond process are given in the noted parent applications.

The present invention arose during development efforts relating to direct bond circuit assemblies and methods involving a lead frame pattern with numerous lead frames including isolated segments or inserts of small size. This type of implementation typically arises in circuit assemblies having control logic or gating circuitry having a lead frame pattern directly bonded on the substrate. The small size of the individual isolated lead frames precludes individual placement of same onto the ceramic substrate prior to the direct bonding process. Furthermore, it is not practical to efficiently oxidize each separate lead frame segment or insert. Furthermore, it is likely that such lead frames would lose alignment during the direct bond processing.

The present invention provides a simple and effective solution to the above noted problems. A lead frame pattern is provided by a plurality of lead frames interconnected and held together by support bridges therebetween which are designed to disappear during the direct bonding operation. The support bridges have a reduced thickness relative to the lead frames and are spaced above the ceramic substrate. In one embodiment, the copper lead frames have a base thickness of 0.010", and the pattern is half etched from below to a thickness of 0.005" at the support bridges to provide short strips of copper connecting adjacent lead frames. During the direct bonding process, the support bridges open, retract and disappear. Upon completion of the direct bonding process, it has been found that there is a highly satisfactory fusion of the copper lead frames to the ceramic substrate, and that there has been virtual elimination of any remnant of the copper support bridges, i.e. the support bridges have been vaporized. The reason for the effect of vaporization of the support bridges is not entirely clear. It is believed that the spacing of the support bridge above the ceramic substrate minimizes heat transfer between the support bridge and the substrate and minimizes any heat sink cooling of the support bridge by the substrate, to aid vaporization of the support bridge.

BRIEF DESCRIPTION OF THE DRAWINGS

Parent Applications

FIG. 2 is an assembled view of the structure of FIG. 1, partially cut away.

FIG. 3 is a sectional view taken along line 3—3 of FIG. 2.

FIG. 4 is an exploded perspective view of an alternate embodiment of a portion of FIG. 1.

FIG. 5 is an exploded perspective view of an alternate embodiment of an electric circuit assembly.

FIG. 6 is a perspective view of an alternate embodiment of a portion of the structure of FIG. 5

FIG. 7 is a perspective view of an alternate embodiment of a portion of the structure of FIG. 5.

Present Invention

Figure 20:
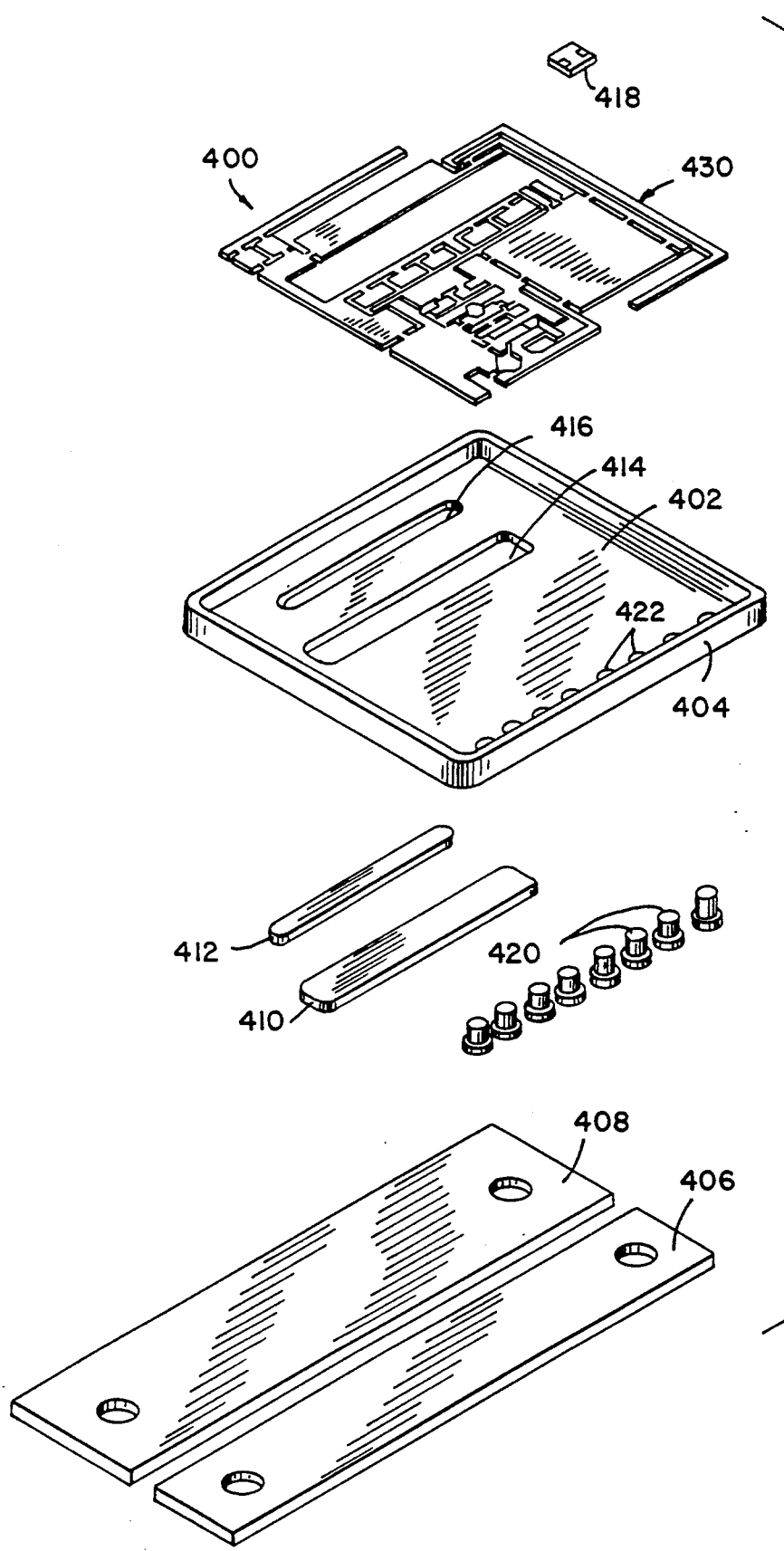

FIG. 20 is an exploded perspective view similar to FIG. 5 and shows an electric circuit assembly in accordance with the present invention.

Figure 21:
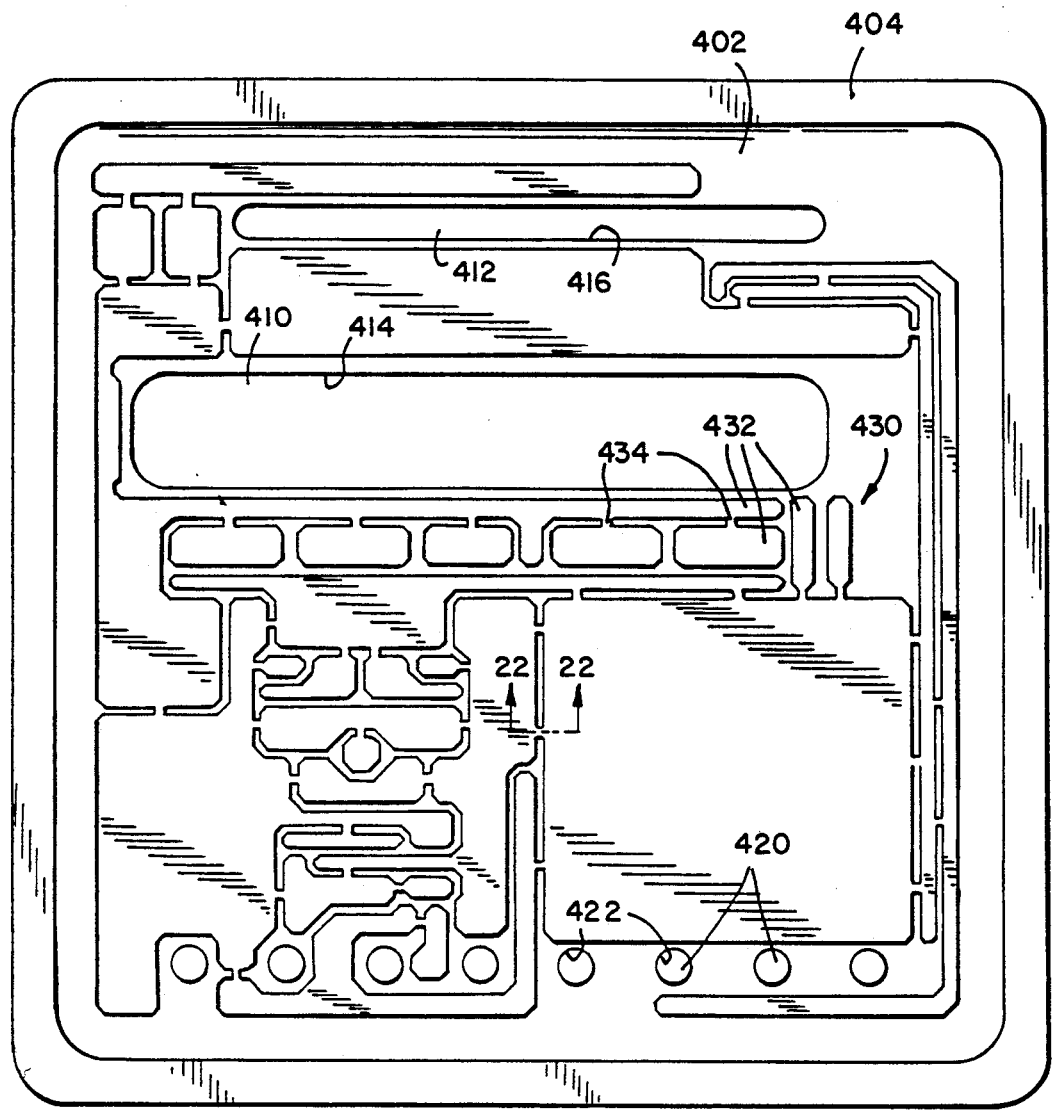

FIG. 21 is a top view of a portion of the structure in FIG. 20 prior to direct bonding.

Figure 22:
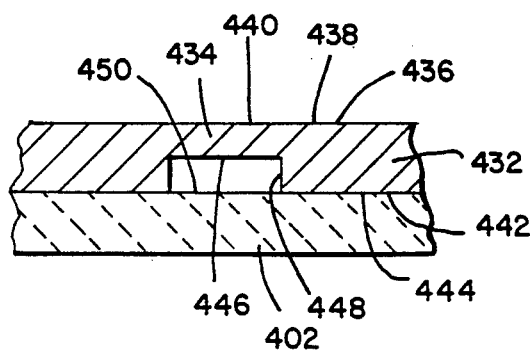

FIG. 22 is a sectional view taken along line 22—22 of FIG. 21.

Figure 23:
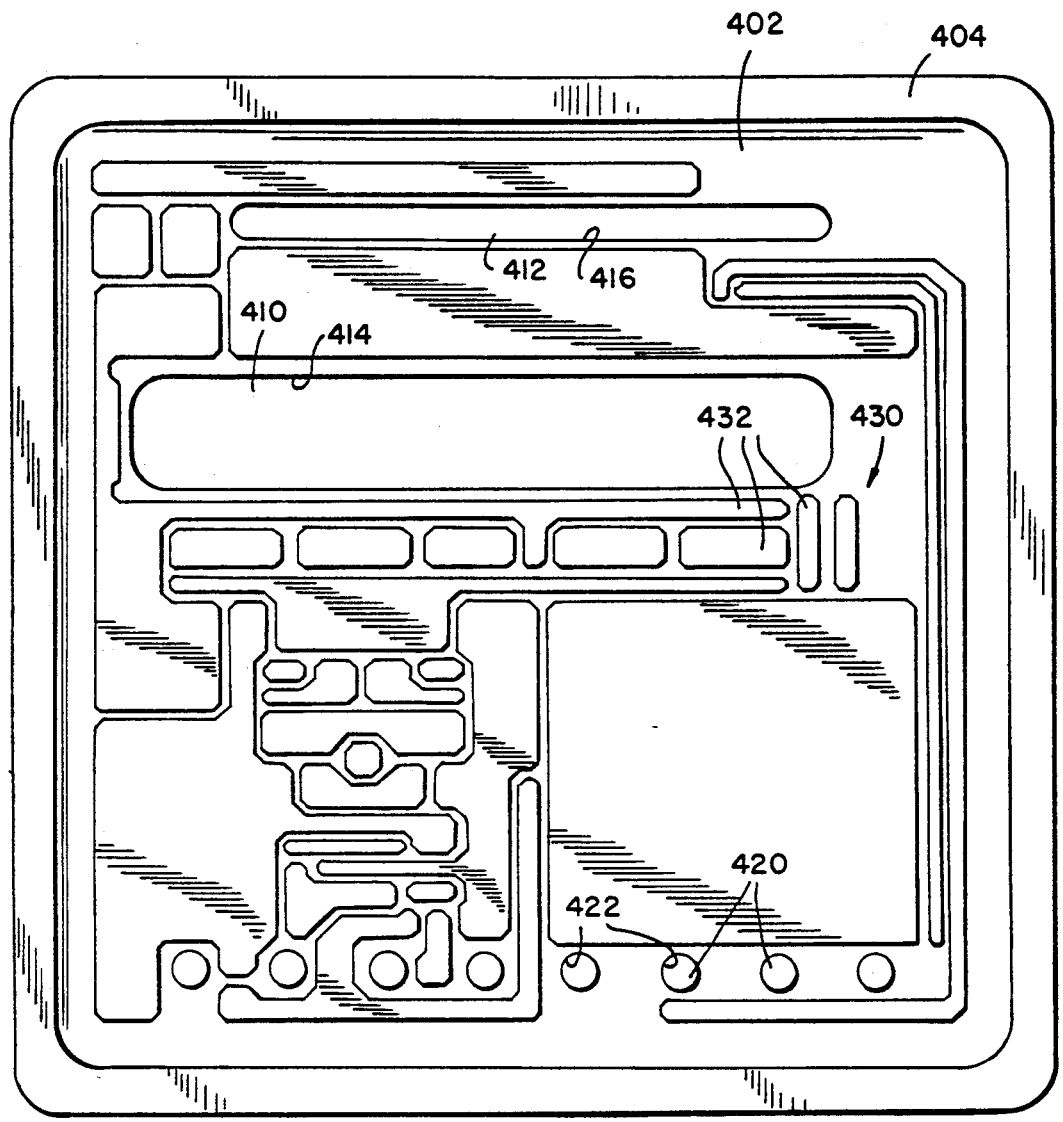

FIG. 23 is like FIG. 21 and shows the circuit assembly after direct bonding, with the support bridges removed.

Figure 24:
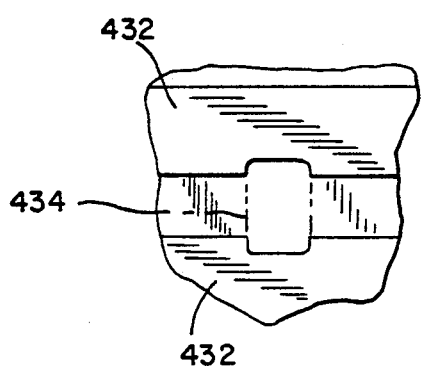

FIG. 24 is an enlarged view of a portion of the structure of FIG. 23.

DETAILED DESCRIPTION

Parent Applications

Figure 1:
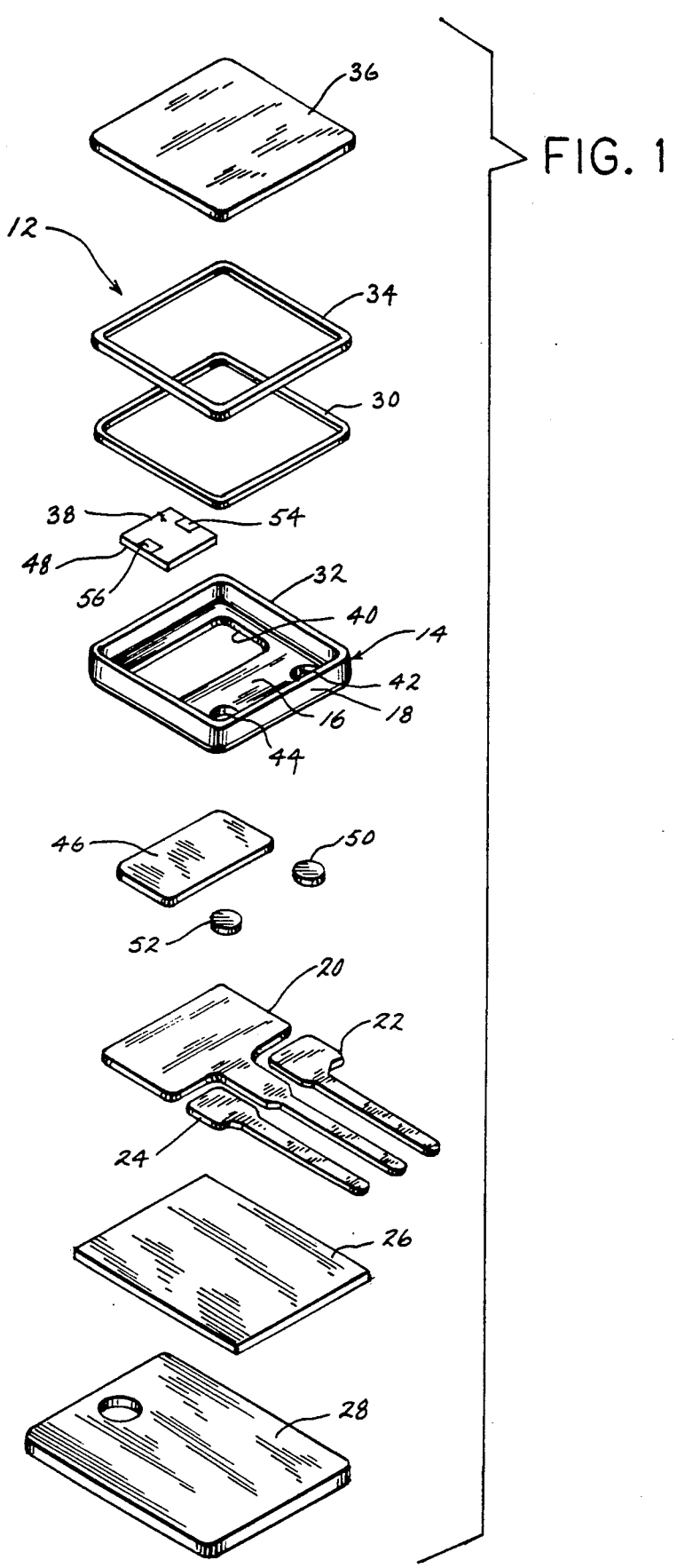
FIG. 1 is an exploded perspective view of an electric circuit assembly.

FIGS. 1-3 show an electric circuit assembly 12. An electrically insulating refractory ceramic tub 14 has a floor 16 and an integral side wall 18 around the perimeter thereof and extending upwardly therefrom. Tub 14 is placed in contact with electrically conductive copper lead frames 20, 22, 24 therebelow, which in turn are placed in contact with electrically insulating refractory ceramic substrate 26 therebelow, which in turn is placed in contact with electrically conductive copper base plate 28 therebelow. A copper ring 30 is placed in contact with the top 32 of side wall 18 of tub 14. A second copper ring 34 is placed in contact with the underside of an electrically insulating refractory ceramic top cover 36.

The assemblies are then directly and hermetically bonded. Copper ring 30, ceramic tub 14, copper lead frames 20, 22, 24, ceramic substrate 26, and copper base plate 28 are placed in the noted contact and heated to a temperature below the melting point of copper ring 30, copper lead frames 20, 22, 24, and copper base plate 28 to form a eutectic with the copper which wets such copper members and the noted ceramic members in contact therewith. The assembly is then cooled, with copper ring 30 bonded to the top 32 of side wall 18 of tub 14 therebelow, and with lead frames 20, 22, 24 bonded to the bottom of floor 16 of tub 14 thereabove, and with lead frames 20, 22, 24 bonded to the top of ceramic substrate 26 therebelow, and with copper base plate 28 bonded to the bottom of ceramic substrate 26 thereabove. The copper members are pre-oxidized, and the assembly is heated in an inert atmosphere, or alternately the assembly is heated in a reactive oxidation atmosphere. The direct bond process is disclosed in U.S. Pat. Nos. 3,744,120, 3,766,634, 3,854,892, 3,911,553, 3,993,411, 3,994,430, 4,129,243, and further reference may be had to "Over 50 Years Experience With The Direct Bond Copper Process", Tegmen Corp., 1201 East Fayette Street, Syracuse, N.Y. Copper ring 34 is directly and hermetically bonded to the underside of ceramic top cover 36 in like manner. An electrical component provided by semiconductor chip 38 is then mounted in the tub and connected to the lead frames. The top cover 36 is hermetically sealed to the top of the side wall of the tub, by welding rings 30 and 34 to each other.

Tub 14 sits on lead frames 20, 22, 24 with the bottom of floor 16 bonded to the top of the lead frames. Floor 16 has a plurality of apertures 40, 42, 44, therethrough. Semiconductor chip 38 is connected to the lead frames through the apertures. Lead frame 20 has a portion 46 extending upwardly in aperture 40. Portion 46 may be formed by half-etching lead frame 20, for example as shown in U.S. Pat. No. 4,630,174, or portion 46 may be soldered or welded to lead frame 20 and/or directly bonded to the sides of aperture 40. Semiconductor chip 38 has a lower contact pad 48 mounted on portion 46 by soldered reflow and in electrical contact with portion 46. Lead frames 22 and 24 have portions 50 and 52 extending upwardly in respective apertures 42 and 44 which likewise may be formed by half-etching, or may be separate pieces welded or soldered to the rest of the lead frame therebelow and/or directly bonded to the sides of the apertures. Semiconductor chip 38 has a pair of upper contact pads 54 and 56 connected by sonically or thermally welded respective jumper leads 58 and 60 to lead frame portions 50 and 52. In the case of a FET chip, lower contact pad 48 is the drain, and upper contact pads 54 and 56 are the source and gate.

FIG. 4 shows an alternate embodiment for a surface mount configuration, without lower ceramic substrate 26 and copper base plate 28. Modified lead frames 20a, 22a, 24a, correspond respectively to lead frames 20, 22, 24, and have respective integral portions 46a, 50a, 52a extending upwardly into apertures 40, 42, 44.

Figure 8:
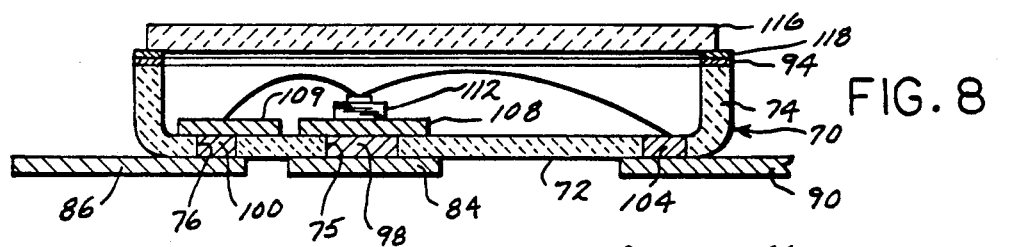
FIG. 8 is a sectional view of the assembled structure of FIG. 5.

FIGS. 5 and 8 show a further embodiment. Ceramic tub 70 has a floor 72 and an integral side wall 74 around the perimeter thereof and extending upwardly therefrom. Floor 72 has a pair of oblong extended apertures 75 and 76 therethrough and a plurality of gate lead apertures 78, 80, 82 therethrough. The bottom of floor 72 is directly bonded to a pair of flat copper conductive lead frames 84, 86, and gate lead frames 88, 90, 92, therebelow. Copper ring 94 is directly bonded on the top 96 of side wall 74. Lead frames 84, 86, 88, 90, 92 have respective portions 98, 100, 102, 104, 106 extending upwardly in respective apertures 75, 76, 78, 80, 82. A further lead frame portion 108 is provided over aperture 75 on lead frame portion 98 to provide a wider drain contact attachment area for the lower drain contacts of FET chips 110, 112, 114. A further lead frame portion 109 is provided over aperture 76 on lead frame portion 100 to provide a wider contact attachment area for the source lead wires from the FET chips The FET chips are connected in parallel on portion 108 on portion 98 of drain lead frame 84, with respective jumper wires connected in parallel to portion 109 on portion 100 of source lead frame 86, and with respective gate jumper wires connected to respective portions 102, 104, 106 of gate lead frames 88, 90, 92. Lead frame portion 98 of lead frame 84 is formed by half-etching as noted above, or is a separate piece soldered or welded to lead frame 84 and/or directly bonded to the sides of aperture 75. The remaining lead frame portions are comparably provided. Lead frame portions 108 and 109 are soldered or welded on respective lead frame portions 98 and 100 after the direct bond step, or are placed on respective lead frame portions 98 and 100 over respective apertures 75 and 76 and directly bonded to the top of floor 72. Ceramic top cover 116 has a copper ring 118 directly bonded to the underside thereof. Rings 94 and 118 are welded to each other to hermetically seal top cover 116 to tub 70.

FIG. 6 shows modified lead frames 84a and 86a corresponding respectively to lead frames 84 and 86, and with portions 98a and 100a extending upwardly therefrom and corresponding to portions 98 and 100.

FIG. 7 shows modified gate lead frames 88a, 90a, 92a, corresponding respectively to gate lead frames 88, 90, 92. Gate lead frames 88a, 90a, 92a, have upper head portions 102a, 104a, 106a corresponding respectively to portions 102, 104, 106, and which are received in respective apertures 78, 80, 82, of the floor 72 of tub 70 and directly bonded thereto Gate lead frames 88a, 90a, 92a, have lower stems 120, 122, 124 extending downwardly therefrom below floor 72 of tub 70.

Figure 9:
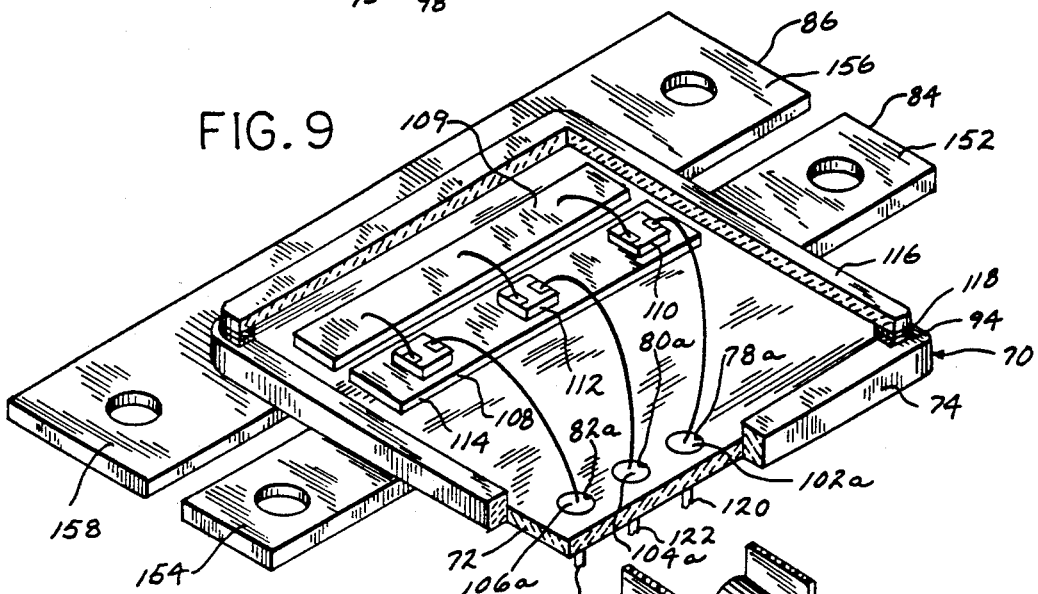
FIG. 9 is a perspective assembled view of structure similar to FIG. 5 and with further modifications.

FIG. 9 shows an assembled view of the structure of FIG. 5, but modified to incorporate the gate lead frames of FIG. 7, and with gate lead frame apertures 78a, 80a, 82a, moved to one side of the tub. For clarity of illustration, simple gating circuitry is shown, though it is within the scope of the invention to include further control gating circuitry within the tub as desired for particular implementations. FIG. 9 shows a single tub 70 which forms the basic building block for multi-tub structure of FIG. 10.

Figure 10:
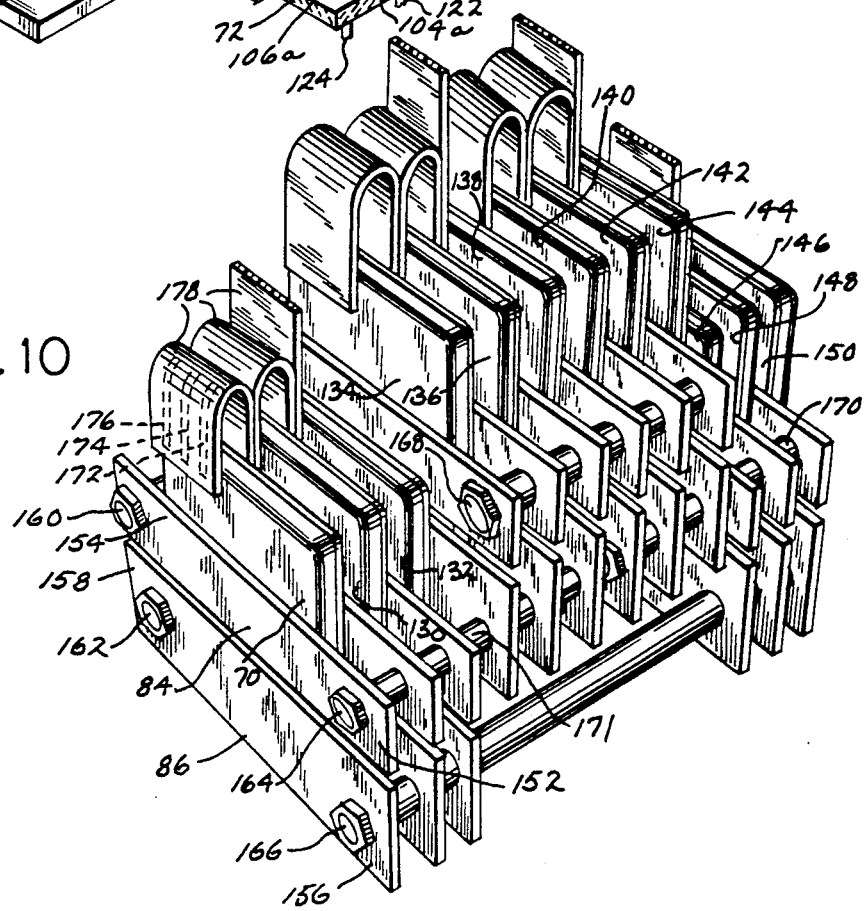
FIG. 10 is a perspective view of a further electric circuit assembly.
Figure 11:
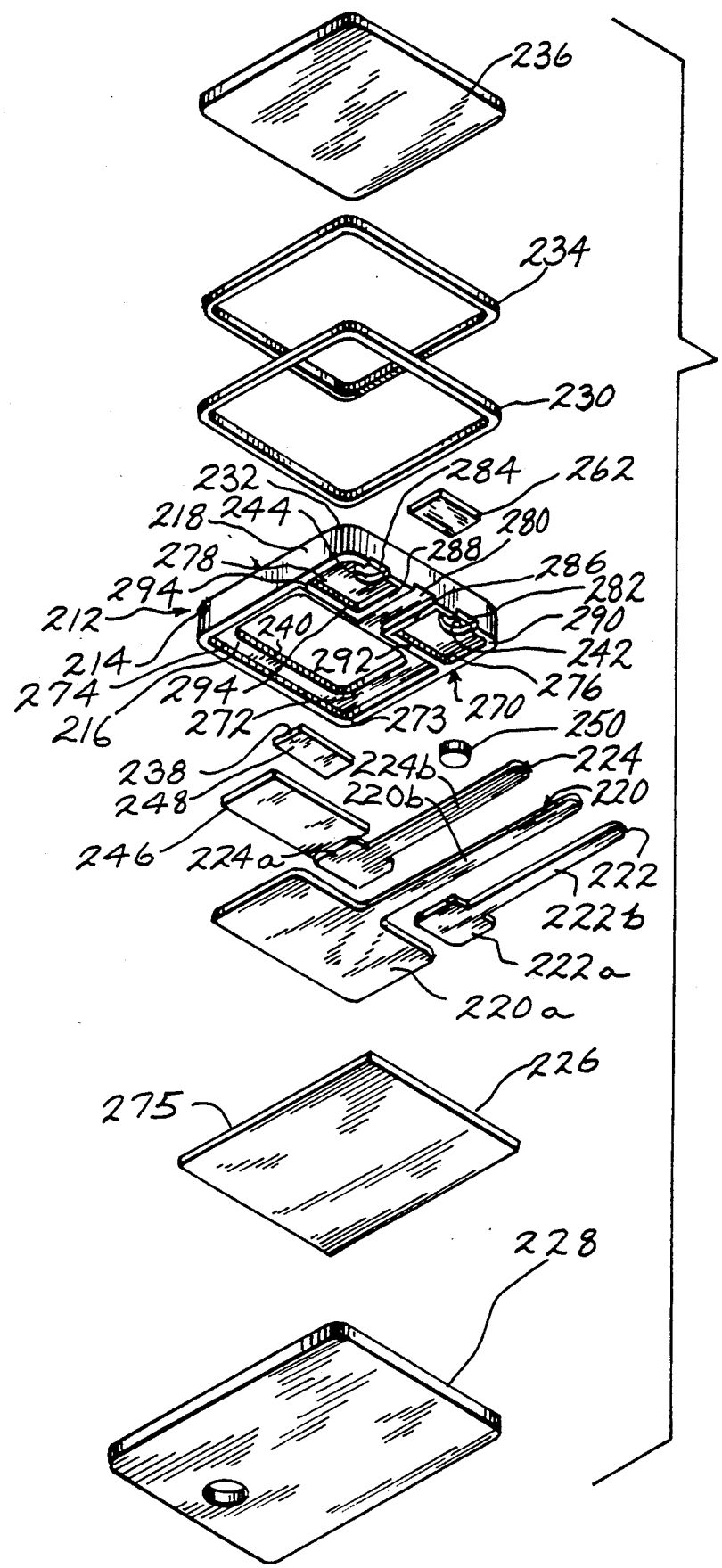
FIG. 11 is an exploded perspective view of another electric circuit assembly.
Figure 12:
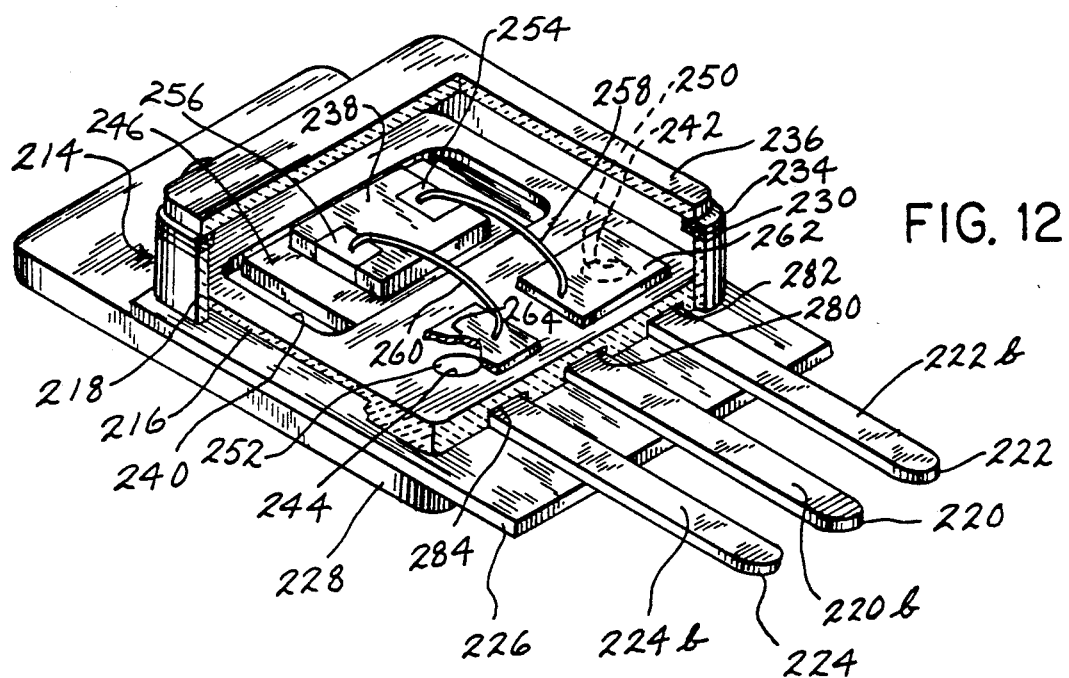
FIG. 12 is an assembled view of the structure of FIG. 11, partially cut away.

FIG. 10 shows a plurality of ceramic tubs 70, 130, 132, 134, 136, 138, 140, 142, 144, 146, 148, 150, stacked on top of each other. Each tub has a floor and an integral side wall around the perimeter thereof and extending upwardly therefrom. Each tub has a pair of flat copper conductor lead frames comparable to lead frames 84 and 86 directly and hermetically bonded thereto as above described. Each tub has a top cover comparable to cover 116 hermetically sealed to the top of the side wall of the tub to close the latter and hermetically seal the respective semiconductor chips.

Lead frame 84 has distal end portions 152 and 154 extending laterally oppositely beyond opposite distal sides of tub 70. Lead frame 86 has distal end portions 156 and 158 extending laterally oppositely beyond the opposite distal sides of tub 70. The other comparable lead frames of the other tubs likewise have distal ends extending laterally oppositely beyond the opposite distal sides of the respective tubs. The tubs are held together in stacked relation by mounting bolts, some of which are seen at 160, 162, 164, 166, 168, 170. The mounting bolts engage the lead frames at the laterally extended distal end portions. The mounting bolts extend upwardly along the stack and perpendicularly to the flat lead frames and extend through apertures in the distal ends of the lead frames. The bolts also extend through hollow cylindrical spacers 171 between the lead frames and which has a length about equal to the height of a tub and cover and which space the ends of the lead frames accordingly. The bolts clamp the lead frames and spacers into mechanical and electrical contact. The lead frames are also spaced by the tubs and covers therebetween The tubs sit on the central portions of the respective lead frames with the bottom of the floor of each tub bonded to the top of the respective pair of lead frames. The tubs are spaced by the lead frames therebetween. Additional spacers may be provided between the tub cover and the next lead frame thereabove, with accordingly longer spacers at the ends of the lead frames, if a larger gap is desired for cooling purposes, e.g. for air or liquid flow therethrough. Gate lead frame stems such as 120, 122, 124, are connected to respective conductor strip patterns 172, 174, 176, on an insulating film 178 The particular electrical contact connection pattern in FIG. 9 is an H-bridge with each tub having three semiconductor switches connected in parallel and in parallel with the three chips in each of two other tubs. Gating strip 178 and its conductive strips are connected to the gate lead frame stems for tubs 70, 130 and 132. Tubs 70, 130 and 132 provide one leg of the H-bridge. A second leg of the H-bridge is provided by tubs 134, 136, 138. The third leg of the H-bridge is provided by tubs 140, 142, 144. The fourth leg of the H-bridge is provided by tubs 146, 148, 150. Bolts 166 and 168 are connected to the load. Bolts 164 and 170 are connected to the AC source. Other stacked structures may of course be constructed. Each tub and cover is an individual hermetic package. The packages are mechanically supported and electrically connected by the bolts and spacers.

FIGS 11-16 show an electric circuit assembly 212. An electrically insulating refractory ceramic tub 214 has a substrate floor 216, FIG. 12, and an integral side wall 218 around the perimeter thereof and extending upwardly therefrom Tub 214 is placed in contact with electrically conductive copper lead frames 220, 222, 224 therebelow, which in turn are placed in contact with electrically insulating refractory ceramic substrate 226 therebelow, which in turn is placed in contact with electrically conductive copper base plate 228 therebelow. A copper ring 230 is placed in contact with the top 232 of side wall 218 of tub 214. A second copper ring 234 is placed in contact with the underside of an electrically insulating refractory ceramic top cover 236.

The assemblies are then directly and hermetically bonded Copper ring 230, ceramic tub 214, copper lead frames 220, 222, 224, ceramic substrate 226, and copper base plate 228 are placed in the noted contact and heated to a temperature below the melting point of copper ring 230, copper lead frames 220, 222, 224, and copper base plate 228 to form a eutectic with the copper which wets such copper members and the noted ceramic members in contact therewith. The assembly is then cooled, with copper ring 230 bonded to the top 232 of side wall 218 of tub 214 therebelow, and with lead frames 220, 222, 224 bonded to the bottom of substrate floor 216 of tub 214 thereabove, and with lead frames 220, 222, 224 bonded to the top of ceramic substrate 226 therebelow, and with copper base plate 228 bonded to the bottom of ceramic substrate 226 thereabove. The copper members are preoxidized, and the assembly is heated in an inert atmosphere, or alternately the assembly is heated in a reactive oxidation atmosphere. Copper ring 234 is directly and hermetically bonded to the underside of ceramic top cover 236 in like manner. An electrical component provided by semiconductor chip 238 is then mounted in the tub and connected to the lead frames. The top cover 236 is hermetically sealed to the top of the side wall of the tub, by welding rings 230 and 234 to each other.

Substrate floor 216 has a plurality of apertures 240, 242, 244, therethrough. Semiconductor chip 238 is connected to the lead frames through the apertures. Lead frame 220 has a portion 246 extending upwardly in aperture 240. Portion 246 may be formed by halfetching lead frame 220, for example as shown in U.S. Pat. No. 4,630,174, or portion 246 may be soldered or welded to lead frame 220, and/or directly bonded to the sides of aperture 240. Semiconductor chip 238 has a lower contact pad 248 mounted on portion 246 by solder reflow and in electrical contact with portion 246. Lead frames 222 and 224 have portions 250 and 252, FIGS. 11, 12 and 15, extending upwardly in respective apertures 242 and 244 which likewise may be formed by half-etching, or may be separate pieces welded or soldered to the rest of the lead frame therebelow and/or directly bonded to the sides of the apertures. Semiconductor chip 238 has a pair of upper contact pads 254 and 256, FIG. 12, connected by sonically or thermally welded respective jumper leads 258 and 260 to respective lead frame portions 250 and 252 as above, or to respective terminal connection pads 262 and 264 sonically or thermally welded or directly bonded on respective portions 250 and 252. In the case of a FET chip, lower contact pad 248 is the drain, and upper contact pads 254 and 256 are the source and gate.

Tub 214 has a lower configured multi-partitioned integral wall 270 extending downwardly from the underside 272 of substrate floor 216. The bottom 273 of wall 270 engages the top side 275 of lower substrate 226 and is sealed thereto by electrically insulating sealing material. The multi-partitioned wall 270 defines recesses 274, 276, 278 in the lower surface of the tub below respective apertures 240, 242, 244. Each lead frame has a respective pad portion 220a, 222a, 224a in a respective recess 274, 276, 278. Each lead frame has a respective extension portion 220b, 224b extending laterally beyond substrates 216 and 226 through a respective slot 280, 282, 284 in wall 270. Wall 270 includes a dividing wall portion 286 between lead frames 220 and 222, and a dividing wall portion 288 between lead frames 220 and 224, which dividing wall portions provide electrical isolation and prevent sparking or voltage crossover between respective lead frames.

Multi-partitioned wall 270 includes an outer peripheral portion 290 generally defining a chamber and generally enclosing the space between substrates 216 and 226 and encompassing recesses 274, 276, 278. Dividing wall portions 286 and 288 are part of inner wall portions dividing the chamber into compartments defining the recesses and receiving respective lead frames. Recess 274 is separated from recess 276 by a first L-shaped dividing wall having a first leg 292 between pad portion 220a of lead frame 220 and pad portion 222a of lead frame 222, and having a second leg provided by above noted dividing wall portion 286 between extension portion 220b of lead frame 220 and pad portion 222a of lead frame 222. Recess 278 is separated from recess 274 by a second L-shaped dividing wall having a first leg 294 between pad portion 224a of lead frame 224 and pad portion 220a of lead frame 220, and having a second leg provided by above noted dividing wall portion 288 between pad portion 224a of lead frame 224 and extension portion 220b of lead frame 220. Pad portions 222a and 224a are spaced and separated by extension portion 220b and dividing wall portions 286 and 288 extending between therebetween. The height of wall 270, the depth of recesses 274, 276, 278, and the height of lead frames 220, 222, 224, are all substantially the same such that the bottom 273 of tub 214 is substantially flush with the bottom of the lead frames. The lead frames engage both the underside 272 of substrate 216 and the top side 274 of substrate 226.

Figure 13:
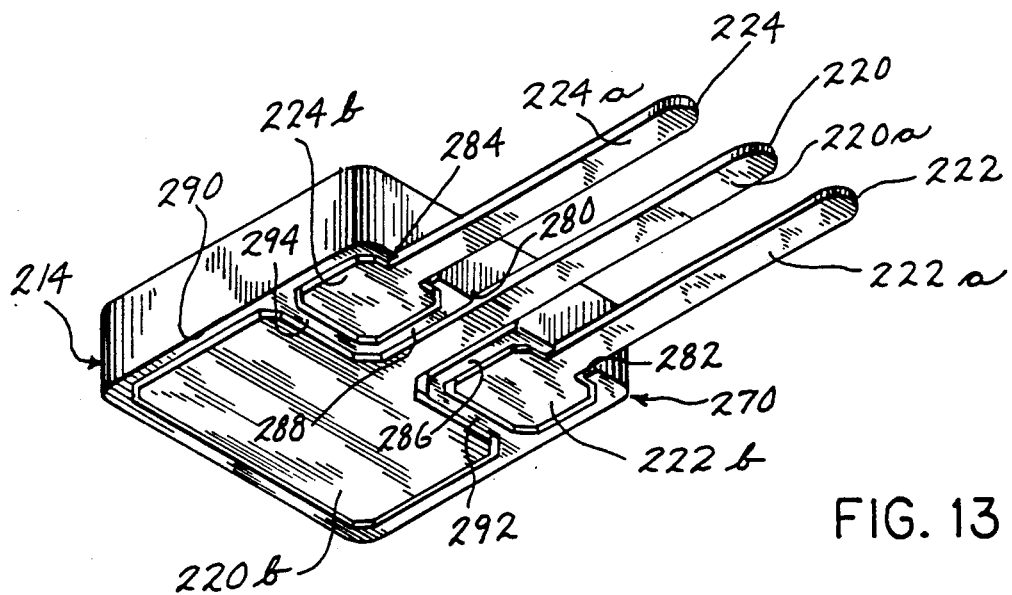
FIG. 13 is a view from below of a portion of the structure of FIG. 12.
Figure 14:
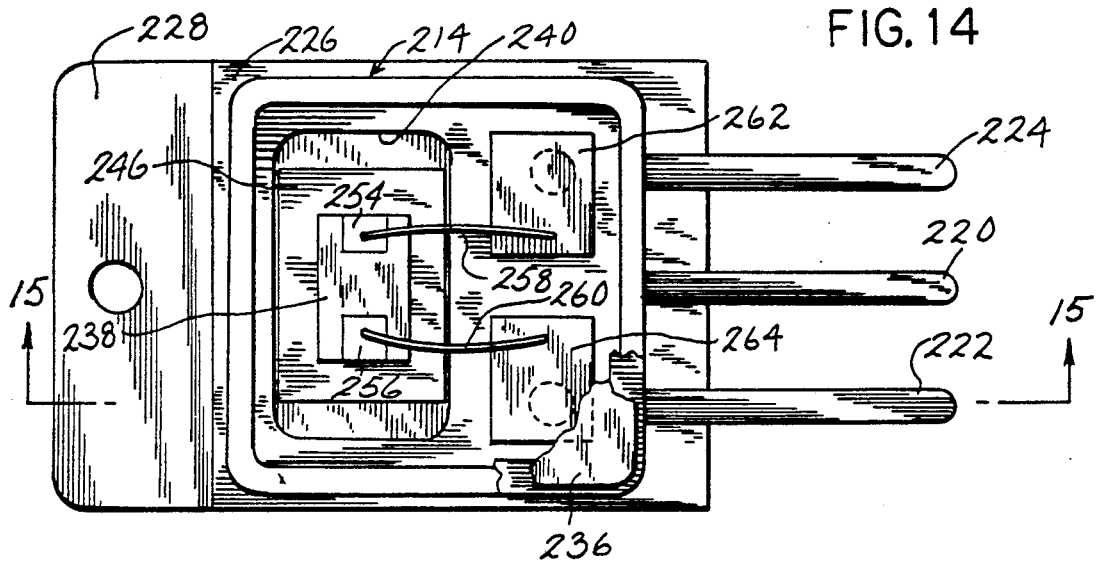
FIG. 14 is a top view of the structure of FIG. 12, partially cut away.
Figure 15:
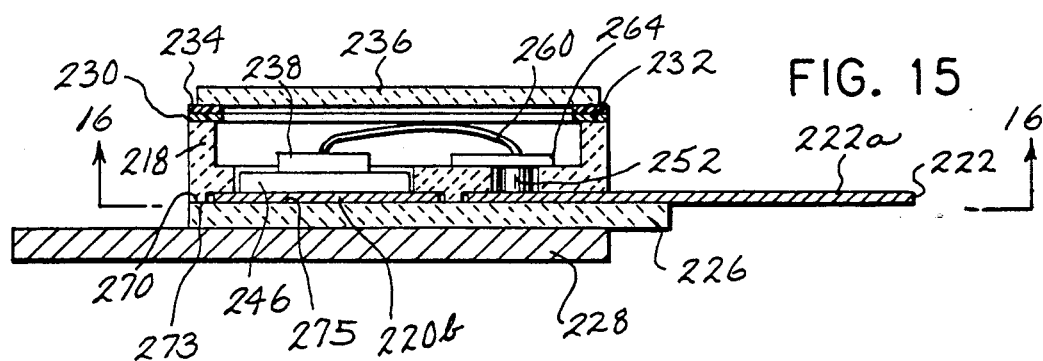
FIG. 15 is a sectional view taken along line 15—15 of FIG. 14.
Figure 16:
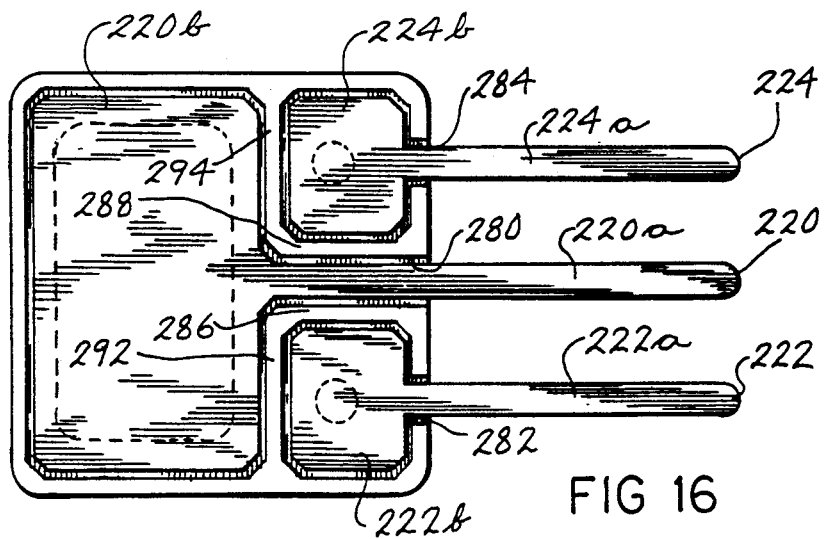
FIG. 16 is a bottom view of a portion of the structure of FIG. 14.

The above circuit assemblies and methods may be practiced with or without hermetic sealing, i.e. with or without upper side wall 218 of the tub, top cover 236, etc. The space between substrates 216 and 226 is not sealed because of the passage of extension portions 220b, 222b, 224b of the lead frames through respective slots 280, 282, 284 in the outer peripheral portion 290 of wall 270. The space between substrates 216 and 226 may be sealed if desired by sealing the interface between the lead frame extensions and respective slots 280, 282, 284, for example by providing electrically insulating sealing material at such interface, or by sealing same during the above noted direct bond process by directly bonding the lead frame extensions to the ceramic material of wall 270 of the tub. In a further alternative, the circuit assembly may be provided to the user as shown in FIG. 13, without substrate 226 and base plate 228.

Figure 17:
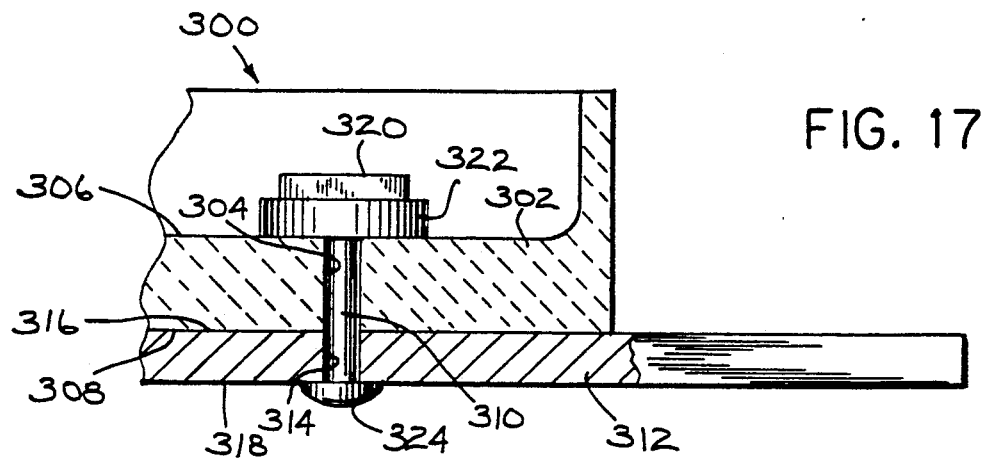
FIG. 17 is a sectional view showing another electric circuit assembly.

FIG. 17 shows an electric circuit assembly 300. An electrically insulating refractory substrate 302, preferably ceramic, and which may be the floor of the above noted tub, has an aperture 304 extending therethrough between top surface 306 and bottom surface 308. An electrically conductive metallic terminal pin 310, preferably copper, is in aperture 304 and is directly bonded to substrate 302 by placing the pin in contact with the substrate, heating the pin and the substrate to a temperature below the melting point of the pin to form a eutectic with the pin which wets the pin and the substrate, and cooling the pin and the substrate, with the pin bonded to the substrate. An electrically conductive metallic lead frame 312, preferably copper or copper clad molybdenum, has an aperture 314 extending therethrough between top surface 316 and bottom surface 318. Lead frame 312 is directly bonded to substrate 302, preferably during the same direct bonding step for bonding pin 310 to substrate 302. Top surface 316 of lead frame 312 is placed in contact with bottom surface 308 of substrate 302 such that apertures 304 and 314 are aligned, and with pin 310 extending therethrough. Pin 310, lead frame 312, and substrate 302 are heated to a temperature below the melting point of pin 310 and lead frame 312 to form a eutectic with pin 310 and with lead frame 312 which wets pin 310 and substrate 302 and wets lead frame 312 and substrate 302. Pin 310 and lead frame 312 and substrate 302 are then cooled, with pin 310 bonded to substrate 302 and with lead frame 312 bonded to substrate 302. Copper members 310 and 312 are pre-oxidized, and the assembly is heated in an inert atmosphere, or alternatively the assembly is heated in a reactive oxidation atmosphere. An electrical component provided by semiconductor chip 320 is then mounted on pin 310, by soldering or the like, and connected as desired to remaining components or lead frames on substrate 302 or within the ceramic tub as noted above.

Pin 310 has upper and lower distally opposite enlarged heads 322 and 324. Upper head 322 engages top surface 306 of substrate 302. Lower head 324 engages bottom surface 318 of lead frame 312. One of the heads, such as head 322, is a preformed flange having a diameter greater than the diameter of aperture 304. The other head, such as head 324, is deformed after insertion of pin 310 through apertures 304 and 314. Various deformation techniques may be used, such as thermal deformation, sonic welding, mechanical staking, upsetting or crimping of material, etc. It is preferred that head 324 be enlarged by thermal deformation during the above noted heating during direct bonding. Heads 322 and 324 enable pin 310 to additionally retain lead frame 312 against substrate 302 in rivet-like manner with compressive clamping force.

Figure 18:
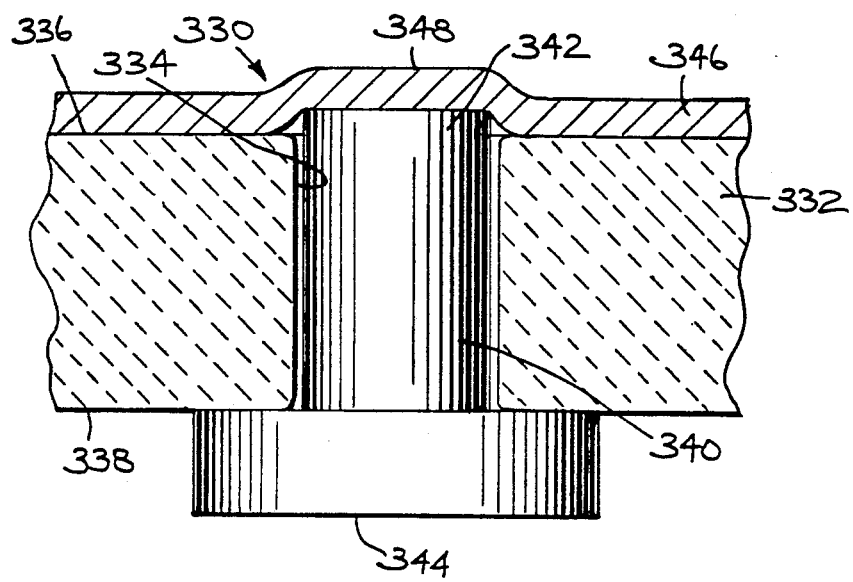
FIG. 18 is a sectional view showing an alternate embodiment.

FIG. 18 shows an electric circuit assembly 330. An electrically insulating refractory substrate 332, preferably copper, has an aperture 334 extending therethrough between top surface 336 and bottom surface 338. An electrically conductive metallic terminal pin 340, preferably copper, is provided in aperture 334 and has upper and lower ends 342 and 344. Lower end 344 is formed by an enlarged flange head engaging bottom surface 338 of substrate 332. Upper end 342 extends out of aperture 334 slightly beyond top surface 336 of substrate 332. Pin 340 is directly bonded to substrate 332 by placing pin 340 in contact with substrate 332, heating pin 340 and substrate 332 to a temperature below the melting point of pin 340 to form a eutectic with pin 340 which wets pin 340 and substrate 332, and then cooling pin 340 and substrate 332, with pin 340 bonded to substrate 332.

An electrically conductive metallic lead frame 346, preferably copper, is directly bonded to substrate 332, preferably during the same direct bonding step in which pin 340 is bonded to substrate 332. Lead frame 346 is placed in contact with top surface 336 of substrate 332. Pin 340 and lead frame 346 and substrate 332 are heated to a temperature below the melting point of pin 340 and lead frame 346 to form a eutectic with pin 340 which wets pin 240 and substrate 332, and to form a eutectic with lead frame 346 which wets lead frame 346 and substrate 332. Pin 340 and lead frame 346 and substrate 332 are then cooled, with pin 340 bonded to substrate 332, and with lead frame 346 bonded to substrate 332. Copper members 340 and 346 are pre-oxidized, and the assembly is heated in an inert atmosphere, or alternatively the assembly is heated in a reactive oxidation atmosphere. Lead frame 346 has an electrical component, such as semiconductor chip 320, mounted thereto, and/or is connected to other components or lead frames on substrate 332 or within a ceramic tub, by lead wires or the like, all as above.

Figure 19:
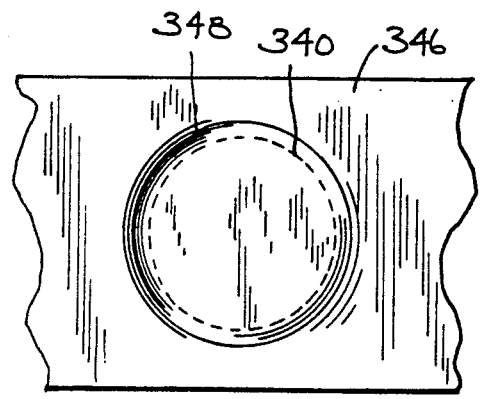
FIG. 19 is a top view of the structure of FIG. 18.

Lead frame 346 extends along top surface 336 of substrate 332 and has a humped configuration 348 over aperture 334. Lead frame 346 at its humped configuration 348 engages upper end 342 of pin 340 and is deformed and raised thereby away from top surface 336 of substrate 332. In one embodiment, FIG. 19, lead frame 346 engages and is directly bonded to top surface 336 of substrate 332 around the entire perimeter of upper end 342 of pin 340 and forms a hermetic seal with top surface 336 of substrate 332 peripherally surrounding upper end 342 of pin 340.

Present Invention

FIG. 20 is similar to FIG. 5 and shows an electric circuit assembly 400. The assembly includes an electrically insulating refractory substrate 402, preferably ceramic. In hermetic sealing implementations, substrate 402 is preferably the floor of a ceramic tub 404, as in FIG. 5, and is sealed by the noted rings such as 94 and 118 and cover 116, FIG. 5. The lower surface of substrate 402 is directly bonded to electrically conductive main terminal lead frames 406 and 408, preferably copper, having respective lead frame portions 410 and 412 in respective apertures 414 and 416 in substrate 402, comparably to main terminal lead frames 84 and 86, FIG. 5, and lead frame portions 98 and 100 and apertures 75 and 76, respectively. The lower surface of substrate 402 is directly bonded to main terminal copper lead frames 406 and 408. Lead frame portions 410 and 412 of respective lead frames 406 and 408 are formed by half etching as noted above, or for example as shown in FIG. 6, or are separate pieces soldered or welded to respective lead frames 406 and 408 and/or directly bonded to the sides of respective apertures 414 and 416. Lead frame portion 410 provides the lower drain contact for FET chips such as 418, and lead frame portion 416 provides the source connection. Gate terminal lead frame pin 420 extend upwardly though apertures 422 in substrate 402 and are directly bonded to the lower surface of substrate 402 and/or the sides of apertures 422. Pins 420 provide gate terminal connection for electrical components such as FET chips 418.

In implementations involving logic control or gating circuitry, an electrically conductive lead frame pattern 430 is directly bonded on the upper surface of substrate 402 for electrical connection between gate terminals 420 and electrical switching components such as FETs 418. Lead frame pattern 430 includes a plurality of lead frames or segments such as 432 interconnected and held together by support bridges such as 434 therebetween. Lead frame pattern 430 is a planar sheet of copper which in one embodiment has a thickness of 0.010", and is cut into a given pattern by the ram or punch of a die. The pattern is then half etched from below in the area of support bridges 434 to a thickness of 0.005", such that support bridges 434 have a reduced thickness relative to lead frames 432. Pattern 430 has an upper planar surface 436, FIG. 22, defined by the upper surface 438 of lead frames 432 and the upper surface 440 of support bridges 434. Upper surfaces 438 and 440 are coplanar. Pattern 430 has a lower surface 442 defined by the lower surface 444 of lead frames 432. The lower surface 446 of support bridges 434 is recessed and spaced above the lower surface 442 of pattern 430. Lower surface 442 of the pattern is generally planar and has a plurality of recesses 448 formed therein at support bridges 434 to provide the noted reduced thickness of support bridges 434 relative to lead frames 432 and to space lower surface 446 of the support bridges above lower surface 444 of the lead frames.

Pattern 430 is directly bonded to substrate 402 by placing lower surface 442 of pattern 430 in contact with upper surface 450 of substrate 402, with lower surface 446 of support bridges 434 spaced above upper surface 450 of substrate 402, heating pattern 430 and substrate 402 to a temperature which vaporizes support bridges 434 and which forms a eutectic with the lower surface 444 of lead frames 432 which wets lower surface 444 of lead frames 432 and upper surface 450 of substrate 402, and cooling pattern 430 and substrate 402, with support bridges 434 removed, FIGS. 23 and 24, and with lower surface 444 of lead frames 432 bonded to upper surface 450 of substrate 402. The direct bonding operation is performed as above. The copper members are preoxidized, and the assembly is heated in an inert atmosphere, or alternately the assembly is heated in a reactive oxidation atmosphere. The assembly is heated to the eutectic temperature of copper, about 1,063° C., for an interval of about 30–60 minutes. The reason or mechanism for the observed vaporization effect is not fully understood. When lower surface 442 of pattern 432 is in contact with upper surface 450 of substrate 402, lower surface 446 of support bridges 434 is spaced above upper surface 450 of substrate 402 by a gap therebetween at recess 448 which minimizes heat transfer between support bridges 434 and substrate 402 and minimizes any heat sink cooling of support bridges 434 by substrate 402. It is believed that this aids the observed vaporization and disappearance of support bridges 434.

It is recognized that various equivalents, alternatives and modifications are possible within the scope of the appended claims.

We claim:

1. A method for making an electric circuit assembly comprising providing an electrically insulating refractory substrate having an upper surface, providing an electrically conductive lead frame pattern having a plurality of lead frames interconnected and held together by support bridges therebetween, said lead frames having a lower surface defining the lower surface of said pattern, said support bridges having a lower surface spaced above said lower surface of said pattern, directly bonding said pattern to said substrate by placing said lower surface of said pattern in contact with said upper surface of said substrate, with said lower surface of said support bridges spaced above said upper surface of said substrate, heating said pattern and said substrate to a temperature which vaporizes said support bridges and which forms a eutectic with said lower surface of said lead frames which wets said lower surface of said lead frames and said upper surface of said substrate, cooling said pattern and said substrate, with said support bridges removed and with said lower surface of said lead frames bonded to said upper surface of said substrate.

2. The method according to claim 1 comprising placing said lower surface of said pattern in contact with said upper surface of said substrate such that said lower surface of said support bridges are spaced above said upper surface of said substrate and define a gap therebetween minimizing heat transfer between said support bridges and said substrate and minimizing any heat sink cooling of said support bridges by said substrate to aid vaporization of said support bridges.

3. A method for making an electric circuit assembly comprising providing an electrically insulating refractory substrate having an upper surface, providing an electrically conductive lead frame pattern having a plurality of lead frames interconnected and held together by support bridges therebetween, said support bridges having a reduced thickness relative to said lead frames, directly bonding said pattern to said substrate by placing said pattern in contact with said upper surface of said substrate, heating said pattern and said substrate to a temperature which vaporizes said support bridges and which forms a eutectic with said lead frames which wets said lead frames and said upper surface of said substrate, cooling said pattern and said substrate, with said support bridges removed and with said lead frames bonded to said upper surface of said substrate.

4. The invention according to claim 3 comprising providing said pattern with an upper planar surface, with the upper surface of said lead frames coplanar with the upper surface of said support bridges, and providing said pattern with a generally planar lower surface having upwardly extending recesses at said support bridges such that the lower surface of said support bridges is spaced above the lower surface of said lead frames, placing said lower surface of said pattern in contact with said upper surface of said substrate, with said lower surface of said support bridges spaced above said upper surface of said substrate.

5. A method for making an electric circuit assembly comprising providing an electrically insulating refractory substrate having an upper surface, providing an electrically conductive lead frame pattern having generally planar upper and lower surfaces and having a plurality of lead frames interconnected and held together by support bridges therebetween, etching said lower surface of said pattern at said support bridges to provide recesses extending upwardly from said lower surface of said pattern at said support bridges to reduce the thickness of said support bridges relative to said lead frames and to space the lower surface of said support bridges above the lower surface of said lead frames, directly bonding said pattern to said substrate by placing the lower surface of said pattern in contact with said upper surface of said substrate, with said lower surface of said support bridges spaced above said upper surface of said substrate, heating said pattern and said substrate to a temperature which vaporizes said support bridges and which forms a eutectic with said lower surface of said lead frames which wets said lower surface of said lead frames and said upper surface of said substrate, cooling said pattern and said substrate, with said support bridges removed and with said lower surface of said lead frames bonded to said upper surface of said substrate.

* * * * *